United States Patent [19]

Johnson

[11] 4,231,445

[45] Nov. 4, 1980

[54] ACOUSTIC LENS SPEAKER CABINET

[76] Inventor: Rubein V. Johnson, 2432 Court St., Muskogee, Okla. 74401

[21] Appl. No.: 966,503

[22] Filed: Dec. 4, 1978

[51] Int. Cl.[3] .......................... G10K 13/00; H05K 5/00

[52] U.S. Cl. .......................................... 181/148; 181/156; 181/160; 181/163; 181/199

[58] Field of Search ............... 181/148, 199, 156, 160, 181/163; 179/1 E, 116

[56] References Cited

U.S. PATENT DOCUMENTS

| | | | |
|---|---|---|---|
| 1,869,178 | 7/1932 | Thuras | 181/160 |
| 1,988,250 | 1/1935 | Olson | 179/116 |
| 2,834,423 | 5/1958 | Bradford | 181/156 |
| 2,915,134 | 12/1959 | Braund | 181/156 |
| 3,727,719 | 4/1973 | Yando | 179/1 E |
| 3,777,844 | 12/1973 | Johnson | 181/199 |
| 3,980,154 | 9/1976 | Johnson | 181/160 |
| 4,142,603 | 3/1979 | Johnson | 181/148 |

*Primary Examiner*—L. T. Hix
*Assistant Examiner*—Benjamin R. Fuller
*Attorney, Agent, or Firm*—Head & Johnson

[57] ABSTRACT

A cabinet for improving the sound output of an amplifier including an upright housing with a speaker mounted on the front, the front having one or more baffle openings, a device herein called a sound lens inserted in the baffle opening, the vibration of the speaker serving to induce vibration of the sound lens by condensation and rarefaction, by the speaker, of the sound waves to either side of the housing so that the sound lens functions as a supplemental and complementary sound source.

6 Claims, 5 Drawing Figures

ACOUSTIC LENS SPEAKER CABINET

BACKGROUND AND OBJECTS OF THE INVENTION

Speaker cabinets employ various devices to produce an improved quality of sound to appease the discriminating ears. For background information as to types of speaker cabinets that provide improved speaker performance, refer to my prior issued U.S. Pat. No. 3,777,844 entitled, "ADJUSTABLE SPEAKER CABINET", issued Dec. 11, 1973 and No. 3,980,154 entitled, "CABINET FOR IMPROVING THE SOUND OUTPUT OF AN AMPLIFIER", issued Sept. 14, 1976, and U.S. Pat. No. 4,142,603, entitled "ADJUSTABLE SPEAKER CABINET", issued Mar. 6, 1979.

It is an object of this invention to improve the performance of a speaker.

More particularly, an object of this invention is to provide a supplemental sound producing device acting in response to the condensation and rarefaction of the air by the speaker.

Another object of this invention is to provide a device herein called a sound lens for use in a speaker cabinet for acting as a supplemental source of sound.

These and other objects and a better understanding of the invention will be had by reference to the description and claims in conjunction with the drawings.

SUMMARY OF THE INVENTION

Figure 1:
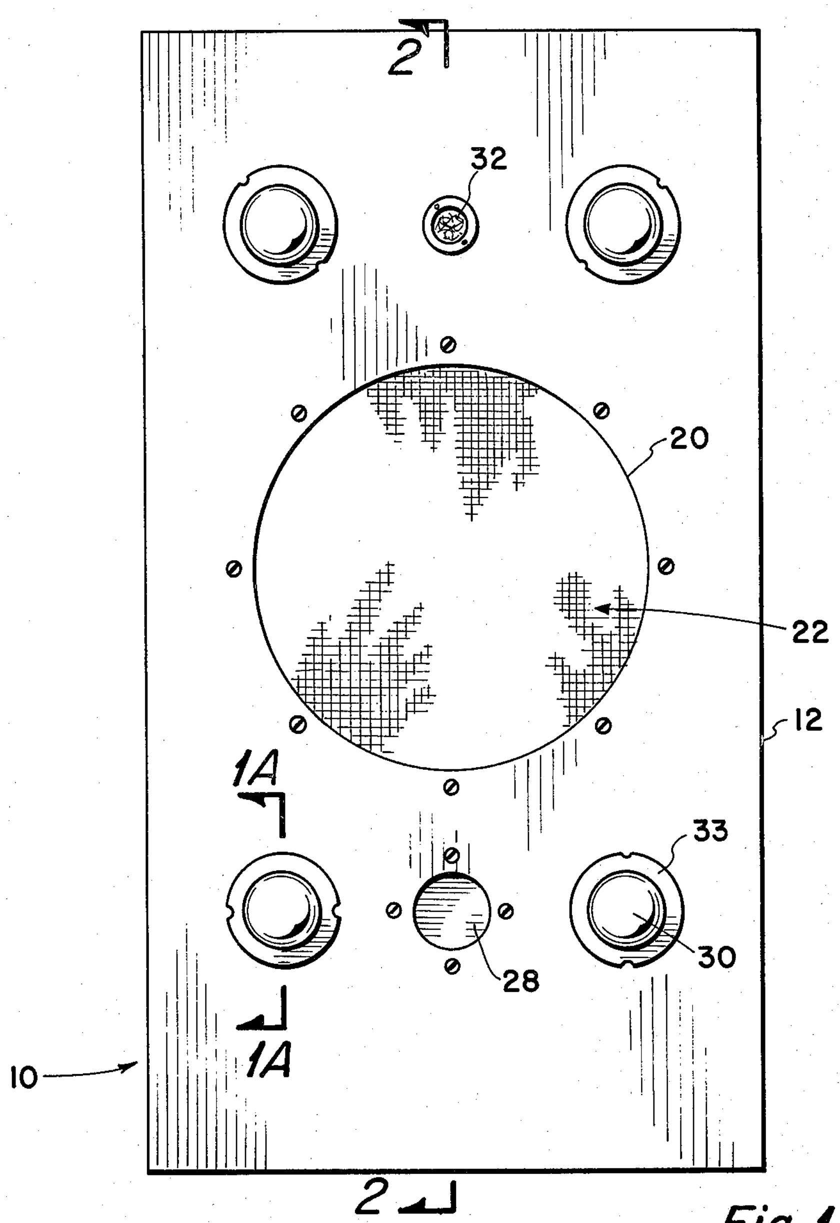
FIG. 1 is a front elevational view of a speaker cabinet embodying the principles of this invention.

A cabinet for improving the sound output of an amplifier, the cabinet being in the form of an upright rectangular housing having a front portion and a rear portion, the speaker mounted on the front portion for outward projection of sound, the front portion provided with a plurality of baffle openings, said baffle openings being provided with a sound wave guide and at least one sound lens functioning to vibrate in response to the sound wave condensation and rarefaction produced by the speaker and to thereby generate sound. Further, a variety of changes may be utilized, like using baffle plates and sound guide tubes to selectively arrange the specific characteristics of the sound to suit a listener's taste.

DESCRIPTION OF THE PREFERRED EMBODIMENT

Referring now to the drawings, reference character 10 generally indicates a speaker cabinet incorporating the principles of this invention. The cabinet 10 is of rectangular upright construction having a front 12, rear 14, side walls (not shown), a bottom 16 and top 18.

The front portion 12 has a speaker opening 20 covered by a mesh screen 22. The speaker 24 is mounted within the interior of the cabinet 10, aligned with the opening 20 and projecting sound outwardly. The speaker 24 has means for attaching to the output of an amplifier. The front portion 12 is provided with a plurality of baffle openings 26 substantially smaller than the speaker opening 20 and spaced away therefrom.

The baffle openings 26 are equipped with various devices to improve the sound quality of the cabinet 10. As shown in FIG. 1, four baffle openings are provided with sound lens 30, one baffle opening is provided with a baffle plate 28, and one baffle opening is provided with a sound wave guide tube 32. The function of each one of these devices will be subsequently described in detail. However, to practice this invention, the cabinet 10 must be provided with at least one baffle opening having a sound lens provided therein, preferably in the front portion 12.

The inventive feature of this invention is the use of a device termed sound lens and shown by numeral 30 in FIG. 1. The sound lens 30 is a metallic tubular member with a closed end 30A. The cylindrical exterior is threaded at 30B, and the device is mounted in baffle opening 26 by means of large nuts 33.

Figure 1A:
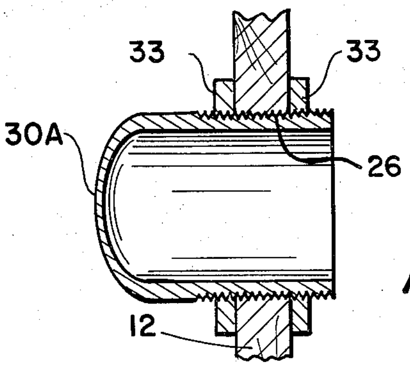
FIG. 1A is a cross-sectional view taken along line A—A of FIG. 1 and shows a sound lens.

The closed end 30A of the sound lens is meniscus shaped or concave-convex in cross-section, as shown in FIG. 1A. The interior surface is concave and the exterior surface is convex, with radii of curvature selected so that the forward portion at the tubular axis is very thin, while the outer portion beyond the tubular axis thickens to equal the wall thickness of the tubular sound wave guide 30, or the maximum thickness may be greater than the wall thickness.

In operation, the speaker 24 exerts, in response to an electrical signal, successive condensation and rarefaction of the air surrounding it. These pressure differences act on the sound lens 30 and particularly at the thinner points 30A, to cause it to displace. This displacement produces sound waves which are projected outwardly and thus the sound lens 30 becomes a sound generating device which is not connected electrically to an amplifier. Each of the sound lens 30 becomes a speaker, since the sound waves or sound phase emanating from the speaker makes a 180° turn within the interior of the cabinet 10 and is projected outwardly through the sound lens 30 as condensation and rarefaction due to the to-and-fro action of the closed end 30A.

The sound lens 30 transmits outwardly and diffuses and spreads the sound as it emanates from the speaker cabinet.

The baffle plate 28, mentioned earlier, is optional, not necessary to practice this invention. Where a baffle plate is desired, it is preferably of metal, such as aluminum or steel and is attached to the front portion 12 by means of nuts and bolts. The function of the baffle plate 28 is similar to the function of the sound lens 30. The successive condensation and rarefaction set up by the speaker 24 in response to electrical signal act on the baffle plate 28 and cause it to vibrate. Thus the baffle plate becomes a sound generating device which is not connected electrically to an amplifier.

Figure 2:
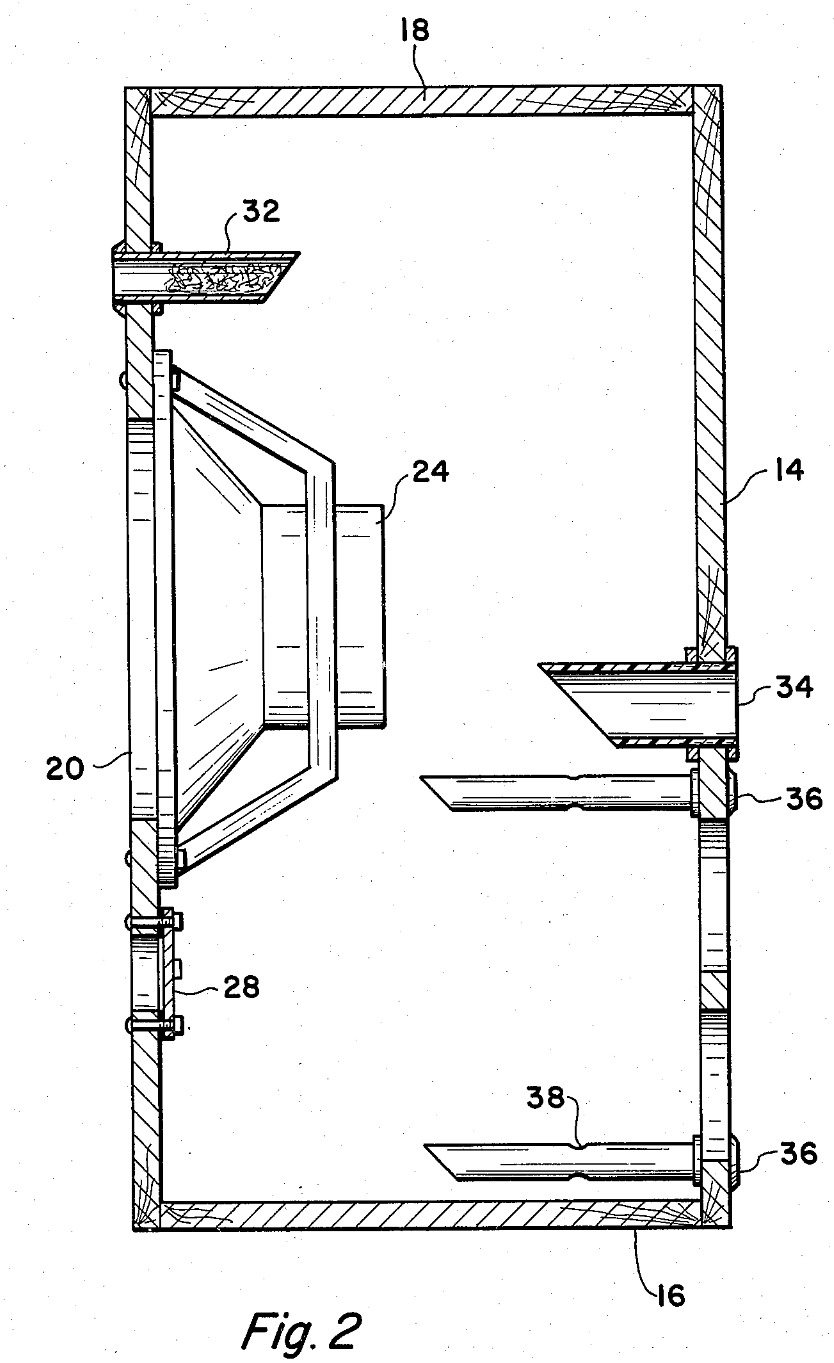
FIG. 2 is an elevational cross-sectional view taken along line 2—2 of FIG. 1 and shows internal configuration.

The sound wave guide tube 32, shown in FIG. 2, is optional also. The purpose and function of the wave guide tube 32 is described in my U.S. Pat. No. 3,777,844. Briefly, the wave guide tube 32 is a tube of approximately one inch in diameter and acts to resonate with a selected frequency component of the audio signal from the speaker 24. The guide tube 32 may be filled with damping material, like steel wool.

Figure 3:
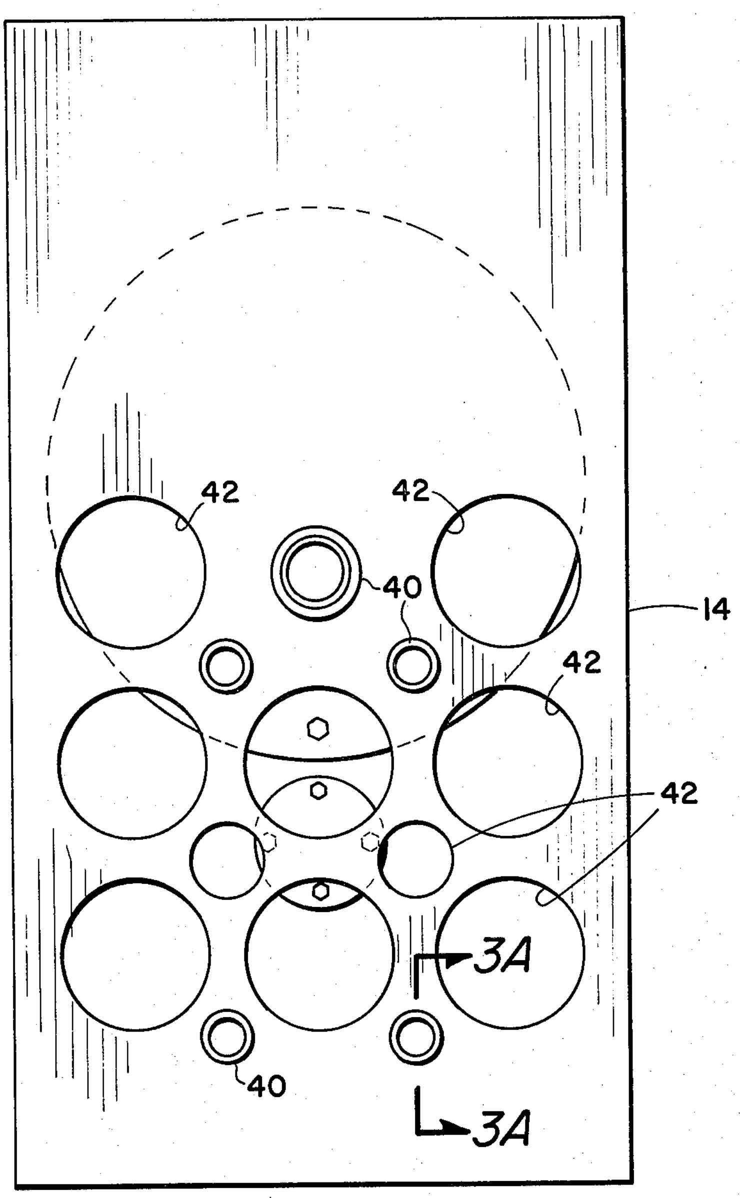
FIG. 3 is a rear-end view of a cabinet speaker and shows various optional openings.
Figure 3A:
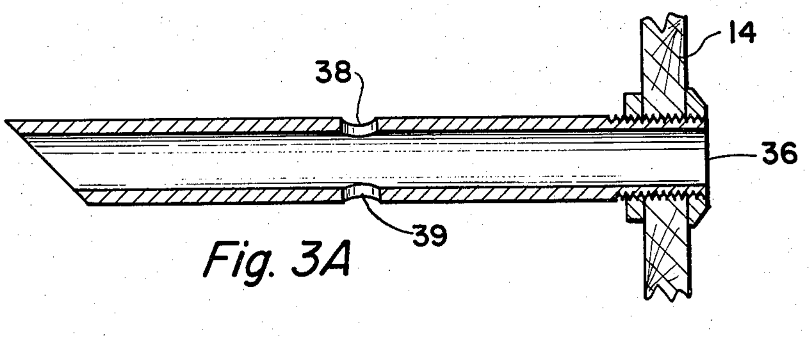
FIG. 3A is a cross-sectional view of a modified sound wave guide tube.

Looking at FIG. 3, the rear portion 14 has a plurality of openings 40 of various sizes, equipped with sound wave guide tubes of different sizes and function similarly to guide tube 32 described before. FIG. 2 shows sound wave guide tubes 34 and 36 of different sizes. A modification of the normal wave guide tubes is shown in 36, the modification comprises substantially aligned openings 38, 39 provided on the upper and lower portion respectively of the elongated tubular portion of the wave guide. Openings 38, 39 enhance the attenuation of the sound waves passing through the wave guide tube 36. The openings may be selectively situated along the length of the tubular member to provide desired attenuation.

Additionally, as shown in FIG. 3, the rear portion 14 has openings 42 of various sizes, the total area of which is preferably at least equal to the vibrational area of the speaker 24.

Sound waves passing out rearwardly through openings 42 and the wave guide tubes 34, 36, return to the ear of the listener, in phase with the sound emanating from the front portion 12. Some of the sound waves return to the front through the sound lens 30. As the sound wave re-enters through the sound lens 30, the rarefactions return as condensations. Thus the sound lens 30 constitutes a vibrating body that generates spherical sound waves composed of "shells" of condensation and rarefaction radiating outwardly in all directions. This creates a brilliance and quality of tone which is superior to that achieved by other known types of speaker cabinets.

The speaker cabinet described provides a unique arrangement wherein sound lens and optionally baffle plates are utilized to function as supplemental speakers, that is, sound generating devices which are not electrically connected to an amplifier. These sound generating devices augment the sound produced by the speaker. This, coupled with the use of selectable sound tube guides of various lengths and characteristics, enable the user of the speaker to customize and tune the speaker cabinet to produce the sound characteristic most desirable to himself.

While the invention has been described with a certain degree of particularity, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

What is claimed is:

1. A cabinet for improving the sound output of an amplifier, comprising:

an upright housing having a front portion and a rear portion, the front portion having one or more baffle openings;

a speaker contained within the housing and mounted on the front for outward projection of sound, the speaker having a vibrational area equal to k, the speaker having means for connecting to the output of an amplifier; and at least one wave guide sound lens, the sound lens in the form of a tubular member of selected length positioned co-axially in said baffle openings, the axis of the tubular member being horizontal and perpendicular to said front portion, the forward or exposed end of the tubular member being closed, the forward end in cross-section being concave-convex with the radii of curvature being selected so that the forward portion at the tubular axis is thin while the outer portions beyond the tubular axis thickens to equal at least the wall thickness of the tubular member.

2. A cabinet for improving the sound output of an amplifier according to claim 1 wherein a flat metal baffle covers at least one of said baffle openings.

3. A cabinet for improving the sound output of an amplifier according to claim 1 including at least one opening in said rear portion, the total area of the openings being not more than the vibrational area of said speaker.

4. A cabinet for improving the sound output of an amplifier according to claim 3 including a plurality of wave guide tubes of selected lengths inserted into selected ones of said openings in said rear portion.

5. A cabinet for improving the sound output of an amplifier according to claim 1 wherein said sound lens is movably secured to said front portion of said housing.

6. A cabinet for improving the sound output of an amplifier according to claim 5 wherein said sound lens is movably secured by means of threads along the tubular member of said sound lens and nuts threaded there onto.

* * * * *